United States Patent [19]
Yoshida et al.

[11] Patent Number: 5,096,762
[45] Date of Patent: Mar. 17, 1992

[54] SEMICONDUCTOR ENCAPSULATING EPOXY RESIN COMPOSITIONS AND SEMICONDUCTOR DEVICES

[75] Inventors: Tetsuo Yoshida, Houya; Yoshio Fujimura, Annaka; Minoru Takei, Gunma, all of Japan

[73] Assignee: Shin-Etsu Chemical Co., Ltd., Tokyo, Japan

[21] Appl. No.: 485,505

[22] Filed: Feb. 27, 1990

[30] Foreign Application Priority Data

Feb. 27, 1989 [JP] Japan .................................. 1-48303

[51] Int. Cl.⁵ ...................... B32B 27/38; B32B 1/00; C08K 3/22
[52] U.S. Cl. ..................................... 428/76; 523/435; 523/440; 523/457; 357/72
[58] Field of Search .................. 523/435, 440, 457; 428/76; 357/72

[56] References Cited

U.S. PATENT DOCUMENTS

| | | | |
|---|---|---|---|
| 4,248,920 | 2/1981 | Yoshizumi et al. | 428/76 |
| 4,650,819 | 3/1987 | Nakamoto et al. | 523/440 |
| 4,720,515 | 1/1988 | Iji et al. | 523/435 |
| 4,923,912 | 5/1990 | Sasaki et al. | 523/435 |

FOREIGN PATENT DOCUMENTS

| | | | |
|---|---|---|---|
| 9634 | 1/1980 | Japan | 523/440 |
| 1190748 | 7/1989 | Japan . | |

*Primary Examiner*—Alexander S. Thomas
*Attorney, Agent, or Firm*—Birch, Stewart, Kolasch & Birch

[57] ABSTRACT

An epoxy resin composition comprising an epoxy resin, a curing agent, a substantially pure alpha-alumina filler, and a silicone-modified epoxy or phenol resin is useful in encapsulating semiconductor devices. The composition can be molded and cured into a product having improved thermal conductivity and moisture resistance.

6 Claims, 1 Drawing Sheet

SEMICONDUCTOR ENCAPSULATING EPOXY RESIN COMPOSITIONS AND SEMICONDUCTOR DEVICES

This invention relates to epoxy resin compositions useful in encapsulating semiconductor devices. More particularly, it relates to a semiconductor encapsulating epoxy resin composition which is moldable into a cured product having improved heat transfer and moisture resistance, as well as semiconductor devices encapsulated with a cured product of the same composition.

BACKGROUND OF THE INVENTION

Prior semiconductor encapsulating epoxy resin compositions often have blended therein inorganic fillers such as fused silica and crystalline silica. The crystalline silica is known to have high thermal conductivity and is thus used in applications where efficient heat transfer is required. By increasing the amount of crystalline silica blended, the thermal conductivity of the composition can be increased, but only to an upper limit on the order of 65 cal/cm·sec·°C. If more crystalline silica is blended to further increase the thermal conductivity beyond this limit, the composition becomes too poor in flow for use in transfer molding.

For further increasing the thermal conductivity of a cured epoxy resin composition, it has been contemplated to use fillers more thermally conductive than crystalline silica, for example, alumina, silicon nitride, aluminum nitride, boron nitride (BN), silicon carbide, and calcium carbonate. These inorganic fillers provide epoxy resin compositions having higher thermal conductivity than crystalline silica filled compositions, but show poor flow and cure into less moisture resistant products. There are no epoxy resin compositions available which possess not only good moldability, but also form cured products having high thermal conductivity and moisture resistance.

Therefore, an object of the present invention is to provide an epoxy resin composition which is readily moldable without substantially forming a fin and which can form a cured product having high thermal conductivity and moisture resistance. Another object of the present invention is to provide a semiconductor device encapsulated with a cured product of such a composition.

SUMMARY OF THE INVENTION

The inventors hereof previously proposed in Japanese Patent Application No. 15344/1988 that when alpha-alumina which has a purity ($Al_2O_3$ content) of at least 99.5% by weight and a reduced impurity content as demonstrated by an $Na_2O$ content of only up to 0.05% by weight and an Na ion content of only up to 5 ppm and a Cl ion content of only up to 1 ppm, and which has a mean particle size of from 5 to 60 $\mu$m and a fraction of particles having a particle size of at least 250 $\mu$m of up to 1% by weight is blended as a filler in a semiconductor encapsulating epoxy resin composition comprising an epoxy resin and a curing agent, the resulting composition exhibits a thermal conductivity two times that of a corresponding composition having the same amount of crystalline silica blended therein. It has been found that the epoxy resin composition is further improved in moldability and cured properties by blending a silicone-modified epoxy resin or silicone-modified phenol resin along with the specific alpha-alumina. The composition is improved in moldability in that it avoids formation of fins which otherwise often form during molding to (1) obstruct soldering operation in encapsulating IC and diodes, (2) cover heat dissipating areas of transistors, or (3) remain attached to the parting line of the associated mold, thus resulting in a reduced effective life for the mold. In addition, the composition results in a cured product having a high thermal conductivity and significantly improved moisture resistance. Therefore, the above-mentioned objects are achieved by this composition.

More particularly, the use of alpha-alumina filler alone is significantly advantageous for the requirements of a high thermal conductivity and a low coefficient of linear expansion as compared with the use of crystalline silica, but there is left, a room for an improvement in moldability, especially with regard to the formation of fins. As compared with an epoxy resin composition filled with quartz ($SiO_2$) powder, an epoxy resin composition filled with alpha-alumina tends to form clear fins of the resin only during molding probably because of lower compatibility between the resin and the filler. The formation of clear fins is undesirable in that in the case of IC and diode encapsulation, such clear fins can form on lead wires and leg portions to impede soldering to these sites. In the case of transistors, heat dissipating members are covered with such clear fins so that heat dissipation is retarded. In addition, the effective life of the mold is reduced since such clear fins can remain attached to the parting line of the mold.

The inventors have found that although use of a highly viscous resin is effective for epoxy resin compositions filled with crystalline silica, it is not effective at all for epoxy resin compositions filled with alpha-alumina. Nevertheless, fin formation can be substantially prevented, that is, moldability is significantly improved by using alpha-alumina in combination with a silicone-modified phenol or epoxy resin, even in a small amount. It has also been found that the addition of a silicone-modified phenol or epoxy resin combined with alpha-alumina is effective in improving the moisture resistance of the composition.

The present invention, which is predicated on this finding, provides a semiconductor encapsulating epoxy resin composition comprising
(A) an epoxy resin,
(B) a curing agent,
(C) a filler in the form of alpha-alumina having a purity of at least 99.5% by weight, an $Na_2O$ content of up to 0.03% by weight, and an Na ion content of up to 5 ppm and a Cl ion content of up to 1 ppm as extracted with water at 100° C., said alpha-alumina having a mean particle size of from 5 to 60 $\mu$m, the fraction of particles having a particle size of at least 250 $\mu$m being up to 1% by weight, and
(D) at least one member selected from the group consisting of a silicone-modified epoxy resin and a silicone-modified phenol resin.

A semiconductor device encapsulated with a cured product of the epoxy resin composition is also encompassed by the present invention.

DETAILED DESCRIPTION OF THE INVENTION

Figure 1:
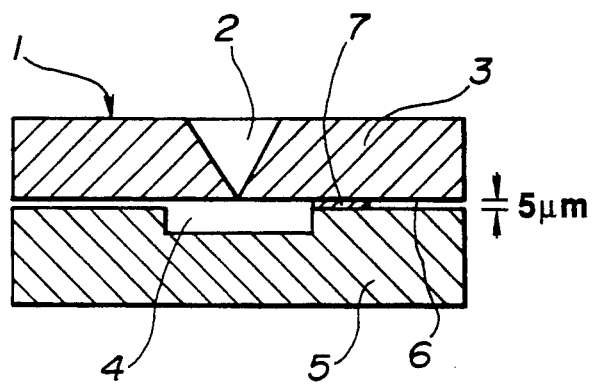
FIG. 1 is a cross section of a mold used in a test for examining whether a fin is formed during molding.

The semiconductor encapsulating composition of the invention is based on an epoxy resin and a curing agent.

The epoxy resin used herein is not particularly limited insofar as it has at least one epoxy group in its molecule. Examples include bisphenol-A type epoxy resins, cycloaliphatic epoxy resins, phenol novolak type epoxy resins, and cresol novolak type epoxy resins, with the phenol novolak type and cresol novolak type epoxy resins being preferred. In view of the moisture resistance of the composition, an epoxy resin containing up to 500 ppm of hydrolysable chlorine, up to 2 ppm of free Na ions, up to 2 ppm of free Cl ions, and up to 100 ppm of organic acids is most preferred.

The curing agent may be selected in accordance with a particular type of epoxy resin. Acid anhydrides such as trimellitic anhydride and tetrahydrophthalic anhydride, and phenolic novolak resins are typical examples. The phenolic novolak resins are especially preferred for the moldability and moisture resistance of the epoxy resin composition. Most preferred as the curing agent is a phenolic novolak resin containing up to 2 ppm of free Na ions, up to 2 ppm of free Cl ions, up to 1% by weight of monomeric phenol, and up to 100 ppm of organic acids such as formic acid resulting from the Cannizzaro reaction of a minor amount of formaldehyde remaining after preparation. If the contents of free Na and Cl ions and organic acids exceed the above-mentioned limits, semiconductor devices encapsulated with the composition would sometimes lose moisture resistance. If the content of monomeric phenol exceeds 1%, there can be left some defects such as voids, unfilled areas or pinholes, and whiskers in molded products of the composition. More preferably, the phenolic novolak resin has a softening point of 50° to 120° C. A softening point of lower than 50° C. would result in a composition having a lower glass transition temperature (Tg) and hence, poor heat resistance. Higher than 120° C. would result in a composition having a higher melt viscosity and hence, poor workability.

The curing agent may be blended in non-limiting amounts. The curing agent is preferably blended such that the molar ratio of the epoxy group in the epoxy resin to the phenolic hydroxyl group or acid anhydride group in the curing agent may range from 0.8:1 to 2:1, more preferably from 1:1 to 1.5:1. If the molar ratio of epoxy/phenolic hydroxyl or acid anhydride group is lower than 0.8, the resulting composition would show poor curing properties and molded products would have a lower glass transition temperature and hence, poor heat resistance. A molar ratio of higher than 2 is less desirable because the glass transition temperature and electrical properties of molded products would be adversely affected.

The composition of the invention uses a specific alpha-alumina as the filler. The alpha-alumina used herein consists of α-crystalline particles of alumina having a purity or aluminum oxide ($Al_2O_3$) content of at least 99.5% by weight, preferably at least 99.8% by weight. If the alpha-alumina used has a purity of lower than 99.5%, the resulting composition exhibits too deteriorated moisture properties to achieve the objects.

The alpha-alumina is generally prepared by finely dividing bauxite containing alumina hydrate as a feed material, introducing the bauxite powder in a sodium hydroxide solution, heating the mixture with steam at 150° to 250° C., thereby melting the powder to form sodium aluminate, effecting hydrolysis, thereby causing aluminum hydroxide to precipitate, and finally sintering the aluminum hydroxide at a temperature of 1000° C. or higher. The alpha-alumina prepared by this process has often left therein $Na_2O$ impurity. In order that alpha-alumina be useful in the present invention, the $Na_2O$ impurity should be removed from the alpha-alumina such that the content of $Na_2O$ is up to 0.03%, preferably up to 0.01% by weight based on the entire weight of the alumina. Sodium oxide may be removed by scrubbing the alpha-alumina in pure water, weakly acidic aqueous solution such as phosphoric acid solution, or alcoholic solution at room temperature to reflux temperature for several to several ten hours. In addition, the alpha-alumina used herein should have an Na ion content of up to 5 ppm, preferably up to 2 ppm and a Cl ion content of up to 1 ppm, preferably up to 0.5 ppm as measured by placing 20 grams of alpha-alumina in 100 grams of ion-exchanged water and effecting extraction at 100° C. for 2 hours. If the $Na_2O$ content and the sodium and chloride ion contents exceeds the above-defined limits, the resulting composition is substantially deteriorated in moisture properties, failing to achieve the objects.

The alpha-alumina used herein can be prepared by methods other than the above-mentioned procedure. For example, (a) alpha-alumina may be prepared by placing highly pure Al pellets in a reactor filled with pure water, inserting a pair of electrodes into the reactor, creating an RF spark discharge thereby causing the Al pellets to react with water to form aluminum hydroxide, and sintering the aluminum hydroxide. Alternatively, (b) alpha-alumina may be prepared by purifying alkyl aluminum or aluminum alcoholate by distillation, and hydrolyzing it into aluminum hydroxide, followed by sintering.

Further, the alpha-alumina used herein has a mean particle size of from 5 to 60 μm, preferably from 10 to 50 μm, while the fraction of particles having a particle size of at least 250 μm is up to 1% by weight, preferably up to 0.5% by weight of the entire weight of the alumina. If the mean particle size of alpha-alumina is smaller than 5 μm, the composition becomes less flowing. If the mean particle size is larger than 60 μm or the fraction of particles having a particle size of at least 250 μm exceeds 1% by weight, the moldability of the composition is deteriorated in that the mold with which the composition s molded is severely worn out or aluminum particles can clog at the gate of the mold, leaving unfilled areas.

Since alpha-alumina is generally prepared by sintering aluminum hydroxide, alpha-crystalline particles often agglomerate into secondary particles during the process. These secondary particles cannot be disintegrated during the milling step of the epoxy resin composition so that they are incorporated in the composition as such. If a semiconductor device is encapsulated with a composition containing such secondary particles, there results in a molded article having pores, through which water can penetrate to deteriorate the moisture properties of the semiconductor device. For this reason, the content of secondary particles in the alpha-alumina is preferably restricted up to 10%, more preferably up to 1% by weight.

In addition, the alpha-alumina particles used herein preferably have an aspect ratio, that is, a ratio of length to breadth, of from 1:1 to 2:1, especially from 1.2:1 to 1.7:1 when alpha-particles are observed in a photograph taken through a scanning electron microscope (SEM). Alpha-alumina particles having an aspect ratio of more than 2 would result in a less flowing composition.

The amount of alpha-alumina blended is not particularly limited in the composition of the invention. As the amount of alpha-alumina blended is increased, the composition increases its thermal conductivity. Preferably, the alpha-alumina is blended in an amount of 60 to 95% by weight, more preferably 75 to 90% by weight based on the total weight of the composition. A composition containing less than 60% by weight of alpha-alumina would sometimes show a low thermal conductivity whereas a composition containing more than 95% by weight of alpha-alumina would sometimes become less flowing.

In the practice of the invention, the specific alpha-alumina defined above may be used either alone as the filler or in combination with another inorganic filler such as crystalline silica and fused silica. The moisture resistance and thermal expansion of the composition are improved particularly when the specific alpha-alumina is blended along with fused silica. Preferably in this case, fused silica is blended in an amount of 5 to 35% by weight, more preferably 5 to 30% by weight based on the total weight of the composition.

The composition of the invention has further blended therein a silicone-modified phenol resin and/or a silicone-modified epoxy resin. Use of the specific alpha-alumina in combination with the silicone-modified phenol or epoxy resin results in an epoxy resin composition having a high thermal conductivity, good moisture properties, and significantly improved moldability.

The silicone-modified phenol and epoxy resins used herein are not particularly limited. One preferred example is (i) a reaction product of (i-a) a silicone resin having a COOH, $NH_2$ or SH group represented by the formula:

$$R^1_a R^2_b SiO_{(4-a-b)/2}$$

wherein $R^1$ is selected from the class consisting of a substituted or unsubstituted monovalent hydrocarbon group having 1 to 10 carbon atoms, a hydroxyl group, and an alkoxy group having 1 to 5 carbon atoms, preferably an alkyl group having 1 to 10 carbon atoms, such as a methyl group and an ethyl group, an aryl group having 6 to 10 carbon atoms, such as a phenyl group, a substituted one of these groups in which at least one hydrogen atom is replaced by a halogen atom, such as $ClC_3H_6-$ and

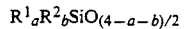

a trialkoxysilyl-substituted alkyl group such as $-C_2H_4Si(OCH_3)_3$, $-C_3H_6Si(OCH_3)_3$, and $-C_2H_4Si(OC_2H_5)_3$, a hydroxyl group, or an alkoxy group having 1 to 5 carbon atoms, such as a methoxy group and an ethoxy group; $R^2$ is selected from the class consisting of a $-RCOOH$ group, a $-RNH_2$ group, and a $-RSH$ group wherein R is a divalent aliphatic or aromatic hydrocarbon group having 1 to 10 carbon atoms; and letters a and b have values within the ranges: $1 \leq a \leq 3$, preferably $1.95 \leq a \leq 2.05$, $0.01 \leq b \leq 0.5$, preferably $0.03 \leq b \leq 0.1$, and $1.01 \leq a+b < 4$, preferably $1.8 \leq a+b < 2.3$, the number of silicon atoms per molecule being an integer of from 20 to 400, preferably 30 to 300, and (i-b) an epoxy resin.

Preferred siloxanes (i-a) are those having a $-R-NH_2$ group, for example, γ-aminopropyldimethylsiloxy-blocked dimethylpolysiloxane. Preferred examples of siloxane (i-a) are shown below.

Formula

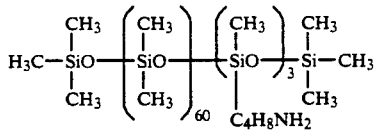

Formula

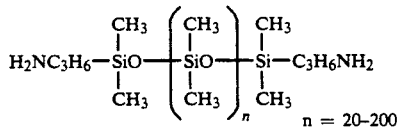

Formula

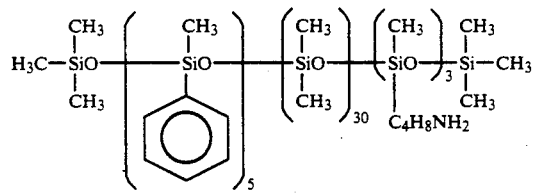

Formula

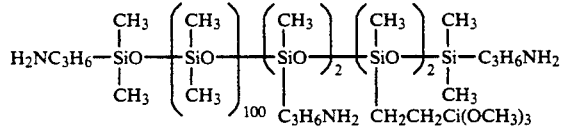

Epoxy resins (i-b) should preferably have 1 to 11 epoxy groups, more preferably 2 to 7 epoxy groups per molecule. The epoxy resins may have an epoxy equivalent of 140 to 350, preferably 150 to 250. Novolak epoxy resins obtained from novolak resins such as phenol novolak, cresol novolak, and bisphenol and epichlorohydrin and alicyclic resins are preferably used.

Another useful example is (ii) an addition polymer between (ii-a) an alkenyl group-containing epoxy or phenol resin, preferably an alkenyl group-containing epoxy or phenol resin of the formula:

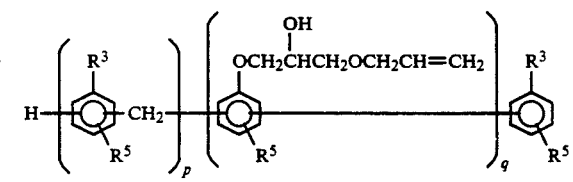

wherein $R^3$ is a

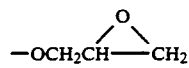

group or an OH group; $R^5$ is a hydrogen atom or a monovalent substituted or unsubstituted hydrocarbon group having 1 to 11 carbon atoms, preferably 1 to 6 carbon atoms, for example, a methyl, ethyl, propyl, butyl, and phenyl group; and letters p and q are $0 \leq p \leq 10$ and $1 \leq q \leq 3$ and (ii-b) an organic silicon compound of the formula:

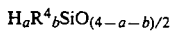

wherein $R^4$ is selected from the class consisting of a substituted or unsubstituted monovalent hydrocarbon group having 1 to 10 carbon atoms, a hydroxyl group, and an alkoxy group having 1 to 5 carbon atoms, preferably an alkyl group having 1 to 10 carbon atoms, such as a methyl group and an ethyl group, an aryl group having 6 to 10 carbon atoms, such as a phenyl group, a substituted one of these groups in which at least one hydrogen, atom is replaced by a halogen atom, such as $ClC_3H_6$—and

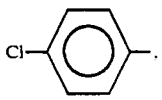

a trialkoxysilyl-substituted alkyl group such as $-C_2H_4Si(OCH_3)_3$, $-C_3H_6Si(OCH_3)_3$, and $-C_2H_4Si(OC_2H_5)_3$, a hydroxyl group, or an alkoxy group having 1 to 5 carbon atoms, such as a methoxy group and an ethoxy group; and letters a and b have positive values within the ranges: $0.01 \leq a \leq 0.5$, preferably $0.03 \leq a \leq 0.1$, $1 \leq b \leq 3$, preferably $1.95 \leq b \leq 2.05$, and $1.01 \leq a+b < 4$, preferably $1.8 \leq a+b < 2.3$, the number of silicon atoms per molecule being an integer of from 20 to 400, preferably 30 to 300, and the number of hydrogen atoms directly attached to silicon atoms per molecule being an integer of at least 1, preferably 2 to 5. It will be understood that the organic silicon compound (ii-b) forms an addition polymer with the epoxy or phenol resin (ii-a) through its $\equiv SiH$ group being added to the alkenyl group of the resin.

Preferred examples of organohydrogensiloxane (ii-b) are shown below.

Formula

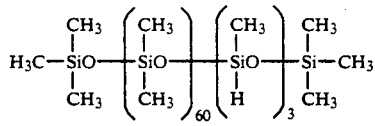

Formula

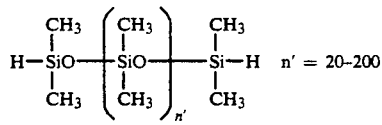

Formula

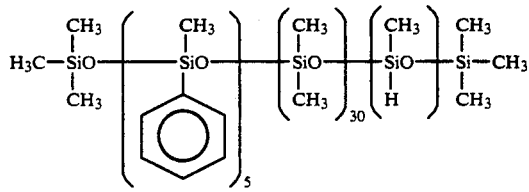

Formula

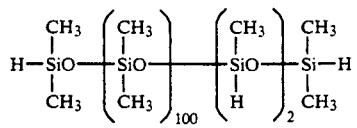

Formula

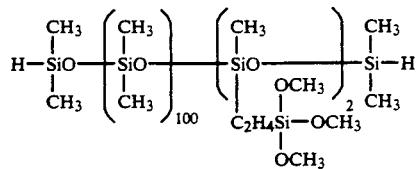

Preferably, the silicone-modified epoxy resin contains up to 500 ppm of hydrolysable chlorine, up to 2 ppm of free Na ions, and up to 2 ppm of free Cl ions, and the silicone-modified phenol resin contains up to 2 ppm of free Na ions, up to 2 ppm of free Cl ions, and up to 100 ppm of organic acids. Semiconductor devices encapsulated with the composition will sometimes become less resistant to moisture if the contents of hydrolysable chlorine, free Na and Cl ions, and organic acids exceed the above-mentioned limits.

The silicone-modified epoxy and phenol resins may be blended in the composition alone or in admixture of two or more. Their blending amount is not particularly limited. Preferably the modified resin is blended in amounts of 3 to 100 parts, more preferably 5 to 50 parts by weight per 100 parts by weight of the total of the epoxy resin and the curing agent in the composition. If the amount of the modified resin is less than 3 parts on the same basis, the composition would be deteriorated in moldability in that a substantial amount of the composition is squeezed out of the mold at the parting line. More than 100 parts of the modified resin would sometimes result in a molded product having reduced mechanical strength.

In addition to the essential components mentioned above, a curing accelerator may preferably be blended in the composition for promoting reaction between the epoxy resin and the curing agent. The curing accelerators include those compounds commonly used for assisting in curing of epoxy compounds, for example, imidazoles, undecene compounds such as 1,8-diazabicyclo(5.4.0)undecene-7 (DBU), and phosphine compounds such as triphenylphosphine alone and mixtures thereof. Triphenylphosphine is a preferred accelerator because the resulting composition has favorable moisture properties. The amount of curing accelerator blended is not particularly limited and it may be used in an effective amount.

If desired, the composition of the invention may further contain any of various well-known additives. Such additives include release agents, for example, waxes such as carnauba wax and fatty acids such as stearic acid and metal salts thereof (carnauba wax is preferred for adherence and release properties); silane coupling agents; pigments such as carbon black, cobalt blue, and red iron oxide; flame retardants such as antimony oxide and halides; antioxidants and the like alone or mixtures thereof.

The epoxy resin composition of the invention may be prepared, for example, by evenly mixing amounts of the necessary components as mentioned above, milling the mixture in milling means pre-heated to 70° to 95° C. such as a kneader, roll mill and extruder, cooling the The silicone-modified epoxy resin used was an addition product of compounds of the following formulae:

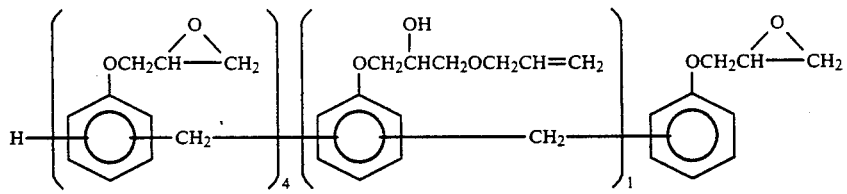

and

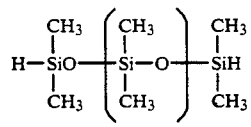

mixture, and comminuting the mixture. One preferred method is melt mixing using a mixing roll or extruder. The order of mixing the components is not critical.

The epoxy resin composition of the invention is most often used in encapsulating semiconductor devices such as IC, LSI, transistors, thyristors, and diodes as well as manufacturing printed circuit boards.

Semiconductor devices may be encapsulated with the composition by any well-known molding methods including transfer molding, injection molding, and casting. Most often, the epoxy resin composition is molded at temperatures of 150° to 180° C. and post cured at temperatures of 150° to 180° C. for about 2 to 16 hours.

EXAMPLE

Examples of the invention are given below by way of illustration and not by way of limitation. Unless otherwise stated, all parts and percents are by weight.

EXAMPLES 1-4

A series of epoxy resin compositions were prepared by blending 62 parts of a cresol novolak epoxy resin (softening point 60° C., hydrolysable Cl 300 ppm, Na ion 1 ppm, Cl ion 1 ppm, organic acid content 50 ppm, and epoxy equivalent 200), 7 parts of a brominated novolak epoxy resin (Br content 35% and epoxy equivalent 286), 31 parts of a novolak phenol resin (softening point 80° C., free phenol content 0.1%, organic acid content 20 ppm, Na ion 1 ppm, and Cl ion 1 ppm), the amount shown in Table 1 of a silicone-modified epoxy resin having the structure defined below, 10 parts of $Sb_2O_3$ per 100 parts of the total of the cresol novolak type epoxy resin, brominated novolak epoxy resin, novolak phenol resin, and silicone-modified epoxy resin, 2 0 parts of γ-glycidoxypropyltrimethoxysilane, 1.5 parts of carnauba wax, 20 part of carbon black, 1.0 parts of triphenylphosphine, and 600 parts of alpha-alumina (purity or $Al_2O_3$ content 99.9%, $Na_2O$ content 0.03%, Na ion 3 ppm and Cl ion 0.5 ppm as extracted with water at 100° C., mean particle size 20 μm, fraction of particles having a particle size of at least 250 μm 0.01%, aspect ratio 1.4). The blends were melt mixed and milled in a mixing roll at 100° C. for 8 minutes, cooled down, and comminuted.

wherein the subscripts are average values.

EXAMPLE 5

An epoxy resin composition was prepared by the same procedure as Example 1 except that 5 parts of a silicone-modified phenol resin having the structure defined below was used instead of the silicone-modified epoxy resin.

The silicone-modified phenol resin used was an addition product of compounds of the following formulae:

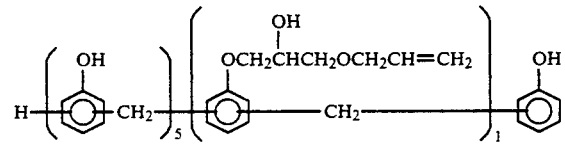

and

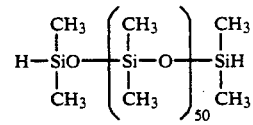

wherein the subscripts are average values.

The epoxy resin compositions of all the examples were subjected to the following tests.

The results are also shown in Table 1. (i) Spiral flow

The spiral flow was measured at 175° C. and 70 $kgf/cm^2$ using a mold according to the EMMI standard.

(ii) Percent corrosion of aluminum wiring

An epoxy resin composition was transfer molded around a 14-pin IC chip specially designed for examining the corrosion of aluminum metal electrodes, and post cured at 180° C. for 4 hours. The molded part was subjected to a pressure cooker test by placing the part in a pressure cooker (PC) and allowing the part to stand in a steam at 120° C. and 2 atmospheres for 1,000 hours. Percent breakage of aluminum electrodes due to corrosion after the 1,000-hour pressure cooker test was measured.

(iii) Fin length

Figure 2:
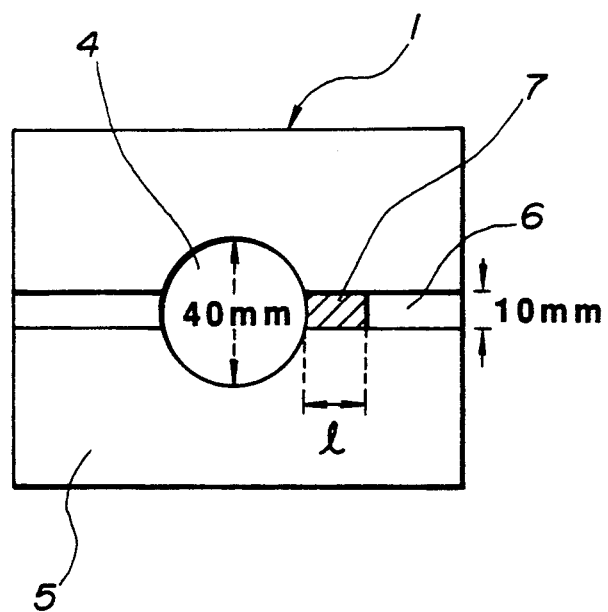
FIG. 2 is a plan view of a lower half of the mold.

A mold designated at 1 in FIGS. 1 and 2 was used. The mold included an upper half 3 having a sprue 2 at the center and a lower half 5 having a circular cavity 4 of 40 mm in diameter faced toward the sprue 2. The upper and lower mold halves 3 and 5 were mated while leaving a gap 6 of 5 μm (high) by 10 mm (wide) therebetween. By introducing into the cavity 4 through the sprue 2, an epoxy resin composition was injection molded under an injection pressure of 70 kg/cm² at a mold temperature of 175° C. A fin 7 was formed in the gap 6 between the upper and lower mold halves 3 and 5. The length 1 of the fin 7 was measured.

(iv) Moldability

A 14-pin IC mold having 160 cavities was used. For each sample, 10 shots were made. Percent occurrence of molding defects such as unfilled pinholes and percent occurrence of fins were measured. Those samples in which fins of longer than 2 mm were formed at the leg of IC chips were rejected.

(v) Flexural strength

Measurement was made according to JIS K.6911.

TABLE 1

|  | Examples | | | | | |
|---|---|---|---|---|---|---|
|  | 1 | 2 | 3 | 4 | 5 | 6* |
| Amount (parts) of silicone modified | | | | | | |
| epoxy resin | 3 | 5 | 20 | 70 | 0 | 0 |
| phenol resin | 0 | 0 | 0 | 0 | 5 | 0 |
| Properties | | | | | | |
| Spiral flow (inch) | 32 | 30 | 25 | 25 | 25 | 30 |
| Al corrosion (%) | 0 | 0 | 0 | 0 | 0 | 20 |
| Fin length (mm) | 2 | 1 | 1 | 1 | 1 | 20 |
| Moldability | | | | | | |
| Molding defect (%) | 0 | 0 | 0 | 0 | 0 | 10 |
| Rejected fin (%) | 0 | 0 | 0 | 0 | 0 | 90 |
| Flexural strength (kg/mm²) | 15 | 15 | 15 | 15 | 15 | 15 |

Example 6 is a control in which neither silicone modified epoxy resin nor silicone-modified phenol resin was blended.

As seen from Table 1, the control composition in which neither silicone-modified epoxy resin nor silicone-modified phenol resin was blended is less resistant against moisture and poor in moldability, and tends to form fins. In contrast, the epoxy resin compositions of the invention have improved thermal conductivity and moisture resistance and are improved in moldability as evidenced by minimized formation of fins.

There has been described a semiconductor encapsulating epoxy resin composition having blended therein a specific alpha-alumina as a filler and a silicone-modified epoxy resin and/or a silicone-modified phenol resin. Fin formation is minimized and moldability is improved. The composition gives a cured product having a high thermal conductivity and excellent moisture resistance. Therefore, a semiconductor device encapsulated with the composition is highly reliable.

Although some preferred embodiments have been described, many modifications and variations may be made thereto in the light of the above teachings. It is therefore to be understood that within the scope of the appended claims, the invention may be practiced otherwise than as specifically described.

We claim:

1. A semiconductor encapsulating epoxy resin composition comprising
   (A) an epoxy resin;
   (B) a curing agent;
   (C) a filler in the form of an α-alumina having a purity of at least 99.5% by weight, a Na₂O content of up to 0.03% by weight, a Na ion content of up to 5 ppm and a Cl ion content of up to 1 ppm as extracted with water at 100° C., said α-alumina having a mean particle size of from 5 to 60 μm with a fraction of particles having a particle size of at least 250 μm up to 1% by weight; and
   (D) at least one member selected from the group consisting of a silicone-modified epoxy resin or a silicone-modified phenol resin which is an addition polymer between (i) an alkenyl group-containing epoxy or phenol resin of the formula:

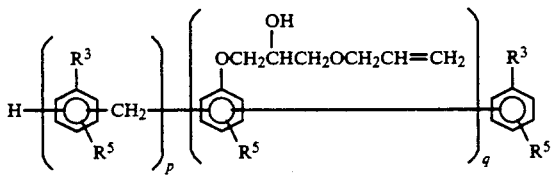

wherein R³ is a

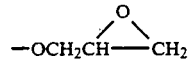

group or an OH group, R⁵ is a hydrogen atom or a monovalent substituted or unsubstituted hydrocarbon group having 1 to 11 carbon atoms, and p and q denote numerical values wherein 0≦p≦10 and 1≦q≦3 and (ii) an organic silicon compound of the formula:

wherein R⁴ is selected from the group consisting of a substituted monovalent hydrocarbon having 1 to 10 carbon atoms, an unsubstituted monovalent hydrocarbon group having 1 to 10 carbon atoms, a hydroxyl, and an alkoxy having 1 to 5 carbon atoms, and a and b denote positive numerical values wherein 0.01≦a≦0.5, 1≦b≦3, and 1.01≦a+b<4, the number of silicon atoms per molecule being an integer of from 20 to 400, and the number of hydrogen atoms directly attached to said silicon atoms per molecule being an integer of at least 1.

2. The composition of claim 1 wherein epoxy resin (A) is a cresol novolak type or phenol novolak type epoxy resin.

3. The composition of claim 1 wherein curing agent (B) is a phenolic novolak resin.

4. The composition of claim 1 comprising 60 to 95% by weight of the alpha-alumina based on the total weight of the composition.

5. The composition of claim 1 comprising 3 to 100 parts by weight of the silicone-modified epoxy or phenol resin per 100 parts by weight of the epoxy resin plus the curing agent.

6. The semiconductor device encapsulated with a cured product of the epoxy resin composition of claim 1.

* * * * *